(12) United States Patent
Tsukiyama et al.

(10) Patent No.: US 10,497,688 B2
(45) Date of Patent: Dec. 3, 2019

(54) SEMICONDUCTOR DEVICE HAVING STACKED LOGIC AND MEMORY CHIPS

(71) Applicant: Toshiba Memory Corporation, Minato-ku (JP)

(72) Inventors: Satoshi Tsukiyama, Yokohama (JP); Yoichiro Kurita, Minato (JP); Hideo Aoki, Yokohama (JP); Kazushige Kawasaki, Yokohama (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 15/926,040

(22) Filed: Mar. 20, 2018

(65) Prior Publication Data

US 2019/0088634 A1    Mar. 21, 2019

(30) Foreign Application Priority Data

Sep. 19, 2017  (JP) ................. 2017-179328

(51) Int. Cl.
*H01L 25/04* (2014.01)
*H01L 25/065* (2006.01)
(Continued)

(52) U.S. Cl.
CPC .......... *H01L 25/18* (2013.01); *H01L 25/0657* (2013.01); *H01L 25/043* (2013.01); *H01L 25/074* (2013.01); *H01L 25/0756* (2013.01); *H01L 25/117* (2013.01); *H01L 2225/06513* (2013.01); *H01L 2225/06517* (2013.01); *H01L 2225/06541* (2013.01); *H01L 2225/06555* (2013.01); *H01L 2225/06572* (2013.01);
(Continued)

(58) Field of Classification Search
CPC . H01L 25/043; H01L 25/0657; H01L 25/074; H01L 25/0756; H01L 25/117; H01L 25/18

See application file for complete search history.

(56) References Cited

U.S. PATENT DOCUMENTS 7,888,796 B2    2/2011   Shinohara
8,237,267 B2    8/2012   Shinohara
(Continued)

FOREIGN PATENT DOCUMENTS

JP    2009-170802    7/2009
JP    2012-015398    1/2012
(Continued)

*Primary Examiner* — Ida M Soward
(74) *Attorney, Agent, or Firm* — Oblon, McClelland, Maier & Neustadt, L.L.P.

(57) ABSTRACT

A semiconductor device according to an embodiment includes a first memory chip having a first front surface and a first back surface and having a first memory circuit provided on the first front surface side; a second memory chip having a second front surface and a second back surface facing the first front surface, having a second memory circuit provided on the second front surface side, and being electrically connected to the first memory chip; and a logic chip having the first memory chip provided between the logic chip and the second memory chip, having a third front surface and a third back surface, having a logic circuit provided on the third front surface side, and being electrically connected to the first memory chip.

19 Claims, 6 Drawing Sheets

(51) Int. Cl.
    *H01L 25/07*     (2006.01)
    *H01L 25/11*     (2006.01)
    *H01L 25/18*     (2006.01)
    *H01L 25/075*     (2006.01)

(52) U.S. Cl.
    CPC ............... *H01L 2225/06586* (2013.01); *H01L 2225/06589* (2013.01)

(56) References Cited

U.S. PATENT DOCUMENTS

| | | | |
|---|---|---|---|
| 8,274,143 B2* | 9/2012 | Fujishima | H01L 21/566 257/621 |
| 8,338,941 B2 | 12/2012 | Lee et al. | |
| 8,710,676 B2* | 4/2014 | Chou | H01L 23/3675 257/621 |
| 8,907,471 B2 | 12/2014 | Beyne et al. | |
| 9,099,459 B2* | 8/2015 | Sato | H01L 25/50 |
| 9,129,958 B2 | 9/2015 | Mallik et al. | |
| 9,230,938 B2* | 1/2016 | Hasebe | H01L 22/14 |
| 9,258,922 B2* | 2/2016 | Chen | H01L 23/49827 |
| 9,396,998 B2* | 7/2016 | Kurita | H01L 25/18 |
| 9,935,087 B2* | 4/2018 | Zhai | H01L 23/3128 |
| 9,984,998 B2* | 5/2018 | Yu | H01L 25/0652 |
| 2009/0152709 A1 | 6/2009 | Shinohara | |
| 2010/0258932 A1* | 10/2010 | Yoshida | H01L 21/561 257/686 |
| 2011/0140285 A1 | 6/2011 | Shinohara | |
| 2012/0001324 A1 | 1/2012 | Aoki et al. | |
| 2013/0242500 A1* | 9/2013 | Lin | H01L 21/563 361/679.32 |
| 2014/0091460 A1* | 4/2014 | Lee | H01L 23/3128 257/737 |
| 2014/0252632 A1* | 9/2014 | Barth | H01L 23/5384 257/773 |
| 2014/0295620 A1* | 10/2014 | Ito | H01L 25/0652 438/108 |
| 2015/0130534 A1* | 5/2015 | Droege | H01L 25/0657 327/565 |
| 2015/0132869 A1* | 5/2015 | England | H01L 21/568 438/17 |
| 2015/0262877 A1 | 9/2015 | Kurita et al. | |
| 2016/0027755 A1* | 1/2016 | Hatasawa | H01L 21/76877 257/737 |
| 2016/0035705 A1* | 2/2016 | Watanabe | H01L 25/065 257/621 |
| 2016/0211244 A1* | 7/2016 | Yu | H01L 25/50 |
| 2016/0284669 A1* | 9/2016 | Yu | H01L 23/34 |
| 2016/0315066 A1* | 10/2016 | Yeh | H01L 25/50 |
| 2018/0166420 A1* | 6/2018 | Park | H01L 25/0657 |
| 2018/0197837 A1* | 7/2018 | Yu | H01L 25/0652 |
| 2018/0226378 A1* | 8/2018 | Hung | H01L 25/0652 |
| 2018/0247915 A1* | 8/2018 | Kinsley | H01L 25/0657 |
| 2018/0308828 A1* | 10/2018 | Lin | H01L 25/50 |
| 2018/0350784 A1* | 12/2018 | Cheng | H01L 21/561 |
| 2019/0006187 A1* | 1/2019 | Yu | H01L 25/50 |

FOREIGN PATENT DOCUMENTS

| | | |
|---|---|---|
| JP | 2013-516060 | 5/2013 |
| JP | 2014-183278 | 9/2014 |
| JP | 2015-507843 | 3/2015 |
| JP | 2015-188052 | 10/2015 |
| TW | 200931631 A | 7/2009 |

* cited by examiner

SEMICONDUCTOR DEVICE HAVING STACKED LOGIC AND MEMORY CHIPS

CROSS-REFERENCE TO RELATED APPLICATION

This application is based upon and claims the benefit of priority from Japanese Patent Application No. 2017-179328, filed on Sep. 19, 2017, the entire contents of which are incorporated herein by reference.

FIELD

Embodiments described herein relate generally to a semiconductor device.

BACKGROUND

There is a semiconductor memory in which a plurality of memory chips are stacked and accommodated in one package. By stacking and accommodating a plurality of the memory chips in one package, it is possible to realize large memory capacity, high speed, and low power consumption of the semiconductor memory. In order to further improve functionality of the semiconductor memory, it is considered that a logic chip in addition to a plurality of the memory chips is accommodated in one package However, the amount of heat generated during operation of the logic chip is larger than that of the memory chip. Therefore, due to the heat generation of the logic chip, the memory chip may malfunction, or the reliability of the memory chip may deteriorate.

DETAILED DESCRIPTION

Figure 1:
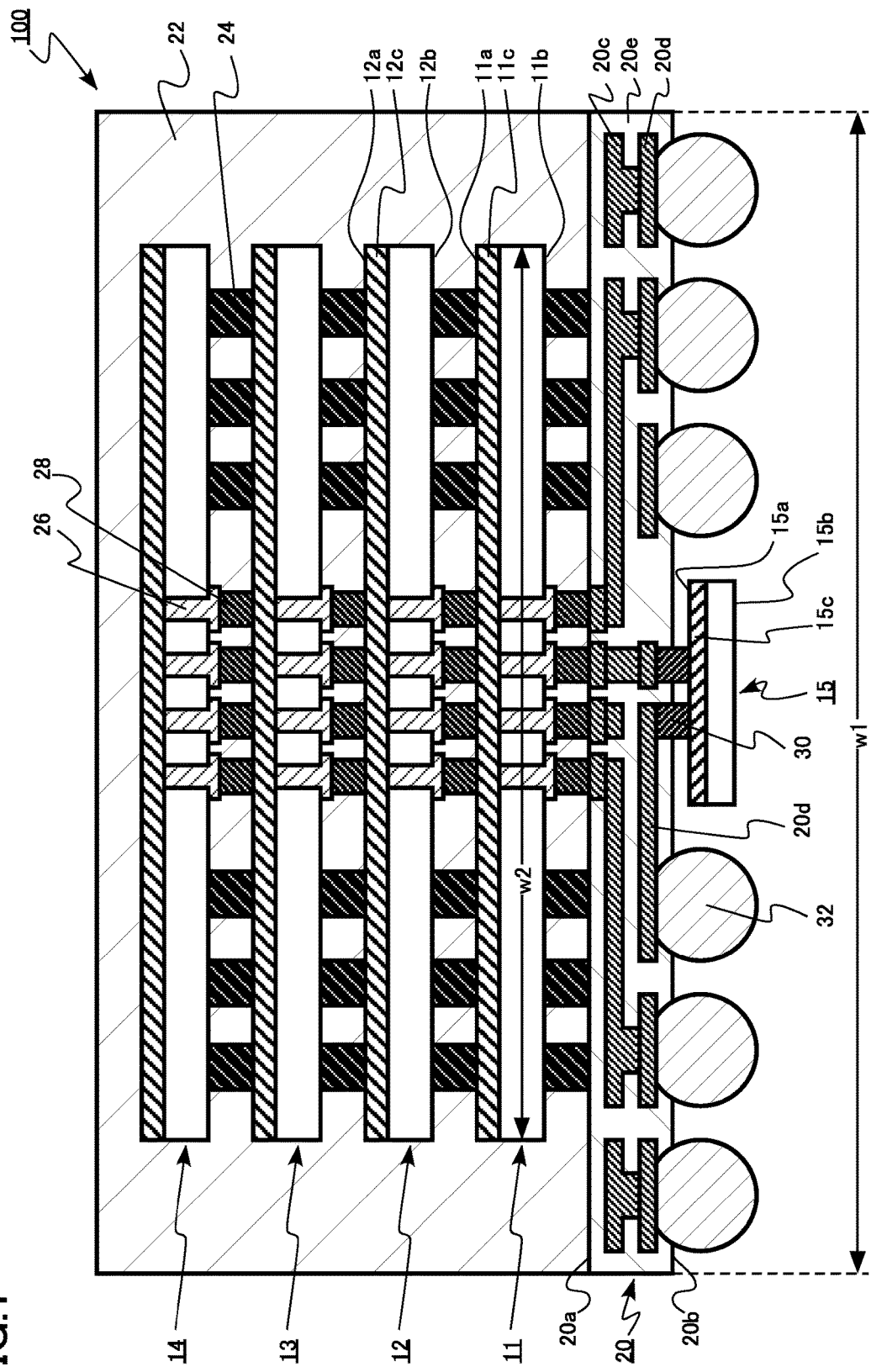
FIG. 1 is a schematic cross-sectional view of a semiconductor device according to a first embodiment.

A semiconductor device according to an embodiment includes: a first memory chip having a first front surface and a first back surface and having a first memory circuit provided on the first front surface side; a second memory chip having a second front surface and a second back surface facing the first front surface, having a second memory circuit provided on the second front surface side, and being electrically connected to the first memory chip; and a logic chip having the first memory chip provided between the logic chip and the second memory chip, having a third front surface and a third back surface, having a logic circuit provided on the third front surface side, and being electrically connected to the first memory chip.

Hereinafter, embodiments of the invention will be described with reference to the drawings. In the following description, the same or similar members are denoted by the same reference numerals and the description of the member which has been described once will not be repeated.

In this specification, the term "above" or "below" may be used for the convenience. The "above" or "below" is a term indicating a relative positional relationship in the drawings and is not a term defining a positional relationship with respect to gravity.

Hereinafter, semiconductor devices according to embodiments will be described with reference to the drawings.

First Embodiment

A semiconductor device according to a first embodiment includes: a first memory chip having a first front surface and a first back surface and having a first memory circuit provided on the first front surface side; a second memory chip having a second front surface and a second back surface facing the first front surface, having a second memory circuit provided on the second front surface side, and being electrically connected to the first memory chip; and a logic chip having the first memory chip provided between the logic chip and the second memory chip, having a third front surface and a third back surface, having a logic circuit provided on the third front surface side, and being electrically connected to the first memory chip.

FIG. 1 is a schematic cross-sectional view of the semiconductor device according to the first embodiment. The semiconductor device according to the first embodiment is a semiconductor memory 100.

The semiconductor memory 100 includes a first memory chip 11, a second memory chip 12, a third memory chip 13, a fourth memory chip 14, a logic chip 15, a redistribution layer (RDL) 20 (wiring body), a sealing resin 22 (first resin), a spacer resin 24 (second resin), a through silicon via (TSV) 26, a microbump 28, a connection terminal 30, and an external terminal 32.

The semiconductor memory 100 is a redistribution layer 20 manufactured by using a semiconductor manufacturing process. And, the semiconductor memory 100 is a fan out wafer level package (FO-WLP) which connects the first memory chip 11, the second memory chip 12, the third memory chip 13, and the fourth memory chip 14 to the external terminal 32.

The first memory chip 11 has a front surface 11a (first front surface), a back surface 11b (first back surface), and a memory circuit 11c (first memory circuit). The back surface 11b is located on the side opposite to the front surface 11a. The first memory chip 11 is manufactured by using, for example, single crystal silicon.

The memory circuit 11c is provided on the front surface 11a side of the first memory chip 11. The memory circuit 11c includes, for example, a transistor, a memory cell, a metal wiring.

The second memory chip 12 is provided on the first memory chip 11. The second memory chip 12 has a front surface 12a (second front surface), a back surface 12b (second back surface), and a memory circuit 12c (second memory circuit). The back surface 12b of the second memory chip 12 is located on the side of the second memory chip 12 opposite to the front surface 12a. The back surface 12b of the second memory chip 12 and the front surface 11a of the first memory chip 11 face each other. The second memory chip 12 is manufactured by using, for example, single crystal silicon.

The memory circuit 12c (second memory circuit) is provided on the front surface 12a side of the second memory chip 12. The memory circuit 12c includes, for example, a transistor, a memory cell, and a metal wiring. The second memory chip 12 has the same configuration as the first memory chip 11.

The third memory chip 13 is provided on the second memory chip 12. The fourth memory chip 14 is provided on the third memory chip 13. The third memory chip 13 and the fourth memory chip 14 have the same configuration as the first memory chip 11.

The first memory chip 11, the second memory chip 12, the third memory chip 13, and the fourth memory chip 14 have a function of storing data. The first memory chip 11, the second memory chip 12, the third memory chip 13, and the fourth memory chip 14 are, for example, NAND-type flash memories.

The first memory chip 11, the second memory chip 12, the third memory chip 13, and the fourth memory chip 14 have the TSVs 26 therein. The microbumps 28 are provided among the first memory chip 11, the second memory chip 12, the third memory chip 13, and the fourth memory chip 14.

The first memory chip 11 and the second memory chip 12, the second memory chip 12 and the third memory chip 13, and the third memory chip 13 and the fourth memory chip 14 are electrically connected to each other by using the TSV 26 and the microbump 28.

The logic chip 15 is provided under the first memory chip 11. The first memory chip 11 is provided between the logic chip 15 and the second memory chip 12. The logic chip 15 faces the back surface 11b of the first memory chip 11.

The logic chip 15 has a front surface 15a (third front surface), a back surface 15b (third back surface), and a logic circuit 15c. The back surface 15b of the logic chip 15 is located on the side opposite to the front surface 15a. The logic chip 15 is manufactured using, for example, single crystal silicon.

The logic circuit 15c is provided on the front surface 15a side of the logic chip 15. The logic circuit 15c includes, for example, a transistor and a metal wiring.

The logic chip 15 has an arithmetic function. The logic chip 15 is, for example, an interface chip.

The redistribution layer 20 is provided between the logic chip 15 and the first memory chip 11. The redistribution layer 20 has a front surface 20a (fourth front surface), a back surface 20b (fourth back surface), a first metal wiring 20c, a second metal wiring 20d (wiring), and a resin layer 20e. The back surface 20b of the redistribution layer 20 and the logic chip 15 face each other.

The first metal wiring 20c and the second metal wiring 20d are provided in the resin layer 20e. The resin layer 20e is, for example, polyimide.

The redistribution layer 20 has a multi-layer wiring structure having two wiring layers of the first metal wiring 20c and the second metal wiring 20d. The redistribution layer 20 may have a single-layer wiring structure with one wiring layer or a multi-layer wiring structure with three or more wiring layers.

The width (w1 in FIG. 1) of the redistribution layer 20 is larger than the width (w2 in FIG. 1) of the first memory chip 11. The area of the redistribution layer 20 is larger than the area of the first memory chip 11.

The redistribution layer 20 electrically connects the logic chip 15 and the first memory chip 11. In addition, the redistribution layer 20 electrically connects the first memory chip 11 and the external terminal 32.

The connection terminal 30 electrically connects the logic chip 15 and the redistribution layer 20. The connection terminal 30 is electrically connected to the second metal wiring 20d. The connection terminal 30 is, for example, a microbump.

The external terminal 32 is provided on the back surface 20b side of the redistribution layer 20. The external terminal 32 is electrically connected to the second metal wiring 20d. The external terminal 32 is, for example, a solder ball.

The external terminal 32 and the connection terminal 30 are electrically connected by the second metal wiring 20d. For example, the external terminal 32 and the connection terminal 30 are electrically connected to each other without passing through a conductor existing on the front surface 20a side of the redistribution layer 20 rather than the second metal wiring 20d. For example, the external terminal 32 and the connection terminal 30 are connected to each other without passing through the first metal wiring 20c. For example, the external terminal 32 and the connection terminal 30 are connected to each other only by a metal wiring in the redistribution layer 20, which is closest to the back surface 20b of the redistribution layer 20. The external terminal 32 and the connection terminal 30 are connected to each other only by, for example, a metal wiring closest to the logic chip 15 in the redistribution layer 20.

The sealing resin 22 covers the first memory chip 11, the second memory chip 12, the third memory chip 13, and the fourth memory chip 14. The sealing resin 22 is also provided between the redistribution layer 20 and the first memory chip 11. In addition, the sealing resin 22 is also provided between the first memory chip 11 and the second memory chip 12, between the second memory chip 12 and the third memory chip 13, between the third memory chip 13 and the fourth memory chip 14.

The sealing resin 22 has a function of protecting the first memory chip 11, the second memory chip 12, the third memory chip 13, and the fourth memory chip 14. For example, the sealing resin 22 contains an epoxy resin as a main component. The sealing resin 22 contains, for example, a filler. The filler is, for example, silica particles.

A plurality of the spacer resins 24 are provided between the redistribution layer 20 and the first memory chip 11. A plurality of the spacer resins 24 are also provided between the first memory chip 11 and the second memory chip 12, between the second memory chip 12 and the third memory chip 13, and between the third memory chip 13 and the fourth memory chip 14. The spacer resin 24 is different from the sealing resin 22. It is preferable that the spacer resin 24 is formed of, for example, a polyimide resin, a phenol resin, an epoxy resin, a benzocyclobutene (BCB) resin, or the like. For example, the spacer resin 24 does not contain a filler.

In the manufacturing process of the semiconductor memory 100, the spacer resin 24 functions as a spacer to secure the distance between chips at the time of sequentially stacking the first memory chip 11, the second memory chip 12, the third memory chip 13, and the fourth memory chip 14 on the redistribution layer 20. In addition, the spacer resin 24 functions as an adhesive for adhering each of the first memory chip 11, the second memory chip 12, the third memory chip 13, and the fourth memory chip 14.

After stacking the first memory chip 11, the second memory chip 12, the third memory chip 13, and the fourth memory chip 14 with the spacer resin 24 interposed therebetween, the first memory chip 11, the second memory chip 12, the third memory chip 13, and the fourth memory chip 14 are sealed by using the sealing resin 22. By using the spacer resin 24, the manufacturing process of the semiconductor memory 100 is simplified.

Next, functions and effects of the semiconductor device according to the first embodiment will be described.

Figure 2:
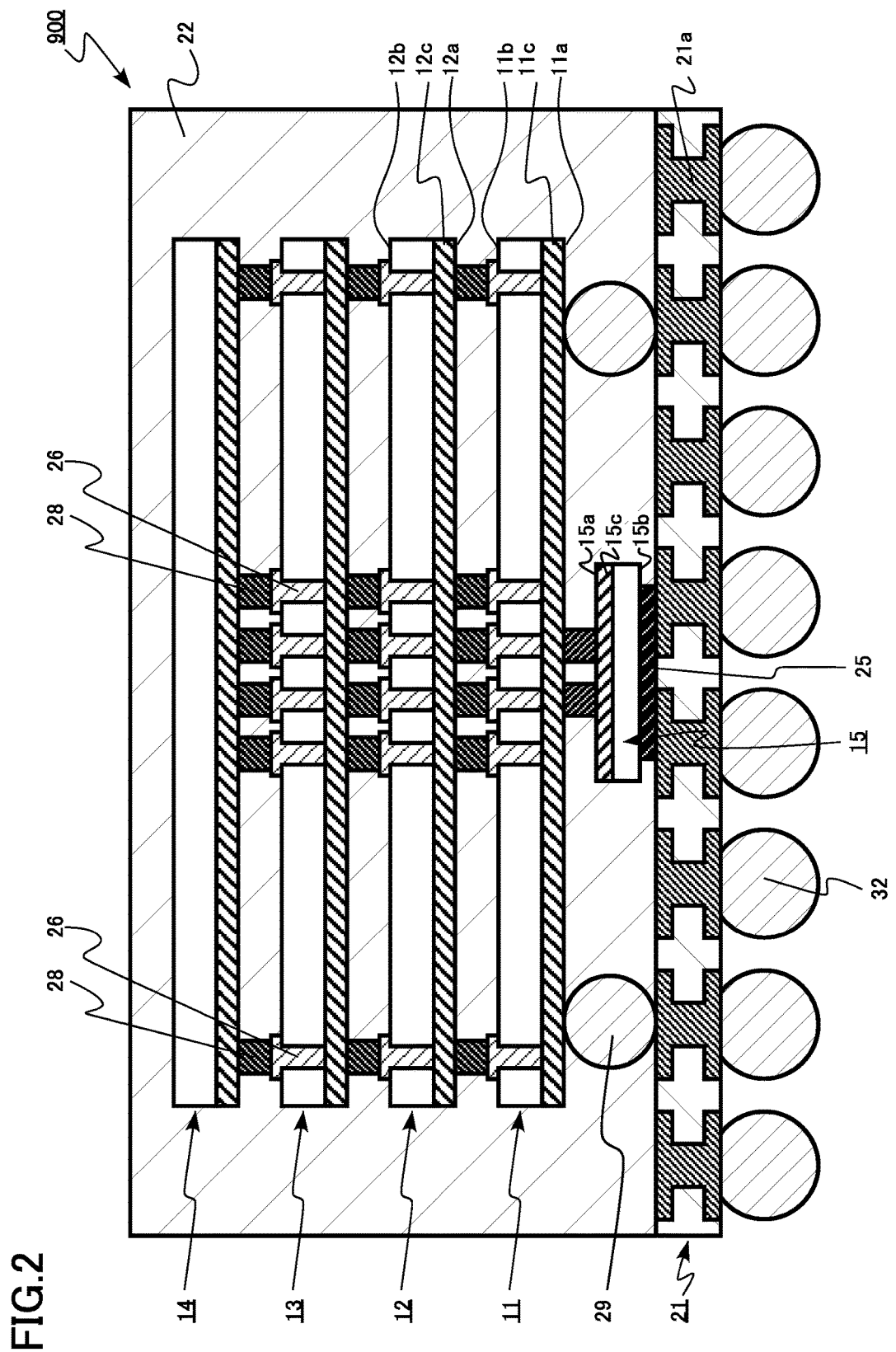
FIG. 2 is a schematic cross-sectional view of a semiconductor device according to Comparative Example.

FIG. 2 is a schematic cross-sectional view of a semiconductor device according to Comparative Example. The semiconductor device according to Comparative Example is a semiconductor memory 900.

The semiconductor memory 900 includes a first memory chip 11, a second memory chip 12, a third memory chip 13, a fourth memory chip 14, a logic chip 15, a silicon interposer 21, a sealing resin 22, an underfill resin 25, a TSV 26, a microbump 28, a bump 29, a connection terminal 30, and an external terminal 32.

The semiconductor memory 900 is a package which connects the first memory chip 11, the second memory chip 12, the third memory chip 13, and the fourth memory chip 14 to the external terminal 32 by using the silicon interposer 21. For example, by using the bump 29 and a TSV 21a in the silicon interposer 21, the first memory chip 11 is electrically connected to the external terminal 32.

The individual configurations of the first memory chip 11, the second memory chip 12, the third memory chip 13, the fourth memory chip 14, and the logic chip 15 are the same as those of the first embodiment.

Unlike the semiconductor memory 100 according to the first embodiment, in the semiconductor memory 900, the logic chip 15 and the front surface 11a of the first memory chip 11 face each other. The logic circuit 15c of the logic chip 15 and the memory circuit 11c of the first memory chip 11 face each other.

Unlike the first embodiment, the first memory chip 11 and the second memory chip 12 are stacked such that the front surface 12a of the second memory chip 12 and the back surface 11b of the first memory chip 11 face each other. Therefore, the memory circuit 12c of the second memory chip 12 exists on the side of the second memory chip 12 closer to the logic chip 15.

In addition, unlike the first embodiment, the logic chip 15 is provided between the silicon interposer 21 which is a wiring body and the first memory chip 11. The underfill resin 25 is provided between the logic chip 15 and the silicon interposer 21.

In addition, unlike the first embodiment, the resin provided between the logic chip 15 and the first memory chip 11, between the first memory chip 11 and the second memory chip 12, between the second memory chip 12 and the third memory chip 13, and between the third memory chip 13 and the fourth memory chip 14 is only the sealing resin 22. The spacer resin 24 is not used.

In the semiconductor memory 900, by accommodating a plurality of the memory chips, that is, the first memory chip 11, the second memory chip 12, the third memory chip 13, and the fourth memory chip 14 in one package, a large capacity, a high speed, and low power consumption of the semiconductor memory 900 are realized. Then, by accommodating the logic chip 15 in the same package, high performance of the semiconductor memory 900 is realized.

However, the amount of heat generated during operation of the logic chip 15 is larger than that of the memory chip. Therefore, due to the heat generation of the logic chip 15, the memory chip may malfunction, or the reliability of the memory chip may deteriorate. In the semiconductor memory 900, in particular, the influence on the first memory chip 11 and the second memory chip 12 close to the logic chip 15 becomes a problem.

Unlike the semiconductor memory 900, in the semiconductor memory 100 according to the first embodiment, the logic chip 15 and the back surface 11b of the first memory chip 11 face each other. In other words, the logic chip 15 does not face the memory circuit 11c of the first memory chip 11. Therefore, it is possible to allow the distance between the logic chip 15 and the memory circuit 11c of the first memory chip 11 to be longer than that of the semiconductor memory 900.

Unlike the semiconductor memory 900, in the semiconductor memory 100 according to the first embodiment, the first memory chip 11 and the second memory chip 12 are stacked such that the back surface 12b of the second memory chip 12 and the front surface 11a of the first memory chip 11 face each other. Therefore, the memory circuit 12c of the second memory chip 12 exists on the side of the second memory chip 12 far from the logic chip 15.

Therefore, in the semiconductor memory 100 according to the first embodiment, it is possible to lengthen the distance between the logic chip 15 and the memory circuit 11c of the first memory chip 11 and the distance between the logic chip 15 and the memory circuit 12c of the second memory chip 12. Therefore, malfunction of the memory chip and deterioration of reliability due to heat generation of the logic chip 15 can be suppressed.

In the semiconductor memory 100 according to the first embodiment, the redistribution layer 20 is provided between the logic chip 15 and the first memory chip 11. Therefore, it is possible to further lengthen the distance between the logic chip 15 and the memory circuit 11c of the first memory chip 11 and the distance between the logic chip 15 and the memory circuit 12c of the second memory chip 12. Therefore, malfunction of the memory chip and deterioration of reliability due to heat generation of the logic chip 15 can be further suppressed.

In particular, by using the redistribution layer 20 including the resin layer 20e having a lower thermal conductivity than a semiconductor such as a silicon as a wiring body, the heat insulating property between the logic chip 15 and the first memory chip 11 and the second memory chip 12 is improved. Therefore, the amount of heat transferred from the logic chip 15 to the first memory chip 11 and the second memory chip 12 can be reduced.

In addition, in the semiconductor memory 100 according to the first embodiment, it is preferable that the connection terminal 30 which connects the external terminal 32 and the logic chip 15 is electrically connected to each other without passing through a conductor existing on the front surface 20a side of the redistribution layer 20 rather than the second metal wiring 20d. The external terminal 32 and the connection terminal 30 are electrically connected to each other without passing through a conductor closer to the fourth front surface 20a of the redistribution layer 20 than the second metal wiring 20d. It is preferable that the external terminal 32 and the connection terminal 30 are connected to each other only by a metal wiring closest to the back surface 20b of the redistribution layer 20 in the redistribution layer 20. With this configuration, the heat of the logic chip 15 is transferred to the external terminal 32 in a short path by using a metal wiring with a high thermal conductivity. Therefore, the amount of heat transferred from the logic chip 15 to the first memory chip 11 and the second memory chip 12 is reduced. Therefore, malfunction of the memory chip and deterioration of reliability due to heat generation of the logic chip 15 can be further suppressed.

In the semiconductor memory 100 according to the first embodiment, it is preferable that the volume ratio of the filler contained in the sealing resin 22 is larger than the volume ratio of the filler contained in the spacer resin 24. In addition, it is more preferred that the sealing resin 22 contains a filler and the spacer resin 24 does not contain a filler. The sealing resin 22 contains a filler, so that the strength of the sealing resin 22 is improved and the thermal conductivity of the entire sealing resin 22 is increased by a filler having a high thermal conductivity.

The spacer resin 24 partially containing no filler is provided between the logic chip 15 and the first memory chip 11 and between the first memory chip 11 and the second memory chip 12, so that the heat insulating property between the logic chip 15 and the first memory chip 11 and between the first memory chip 11 and the second memory chip 12 is improved. Therefore, the amount of heat transferred from the logic chip 15 to the first memory chip 11 and the second memory chip 12 is reduced. Therefore, malfunction of the memory chip and deterioration of reliability due to heat generation of the logic chip 15 can be further suppressed.

As described above, according to the semiconductor memory 100 according to the first embodiment, malfunction of the memory chip and deterioration of reliability due to heat generation of the logic chip 15 can be suppressed.

Second Embodiment

A semiconductor device according to a second embodiment is different from the first embodiment in that the first back surface of the first memory chip and the third back surface of the logic chip face each other. Hereinafter, a portion of the redundant content described in the first embodiment will be omitted in the description.

Figure 3:
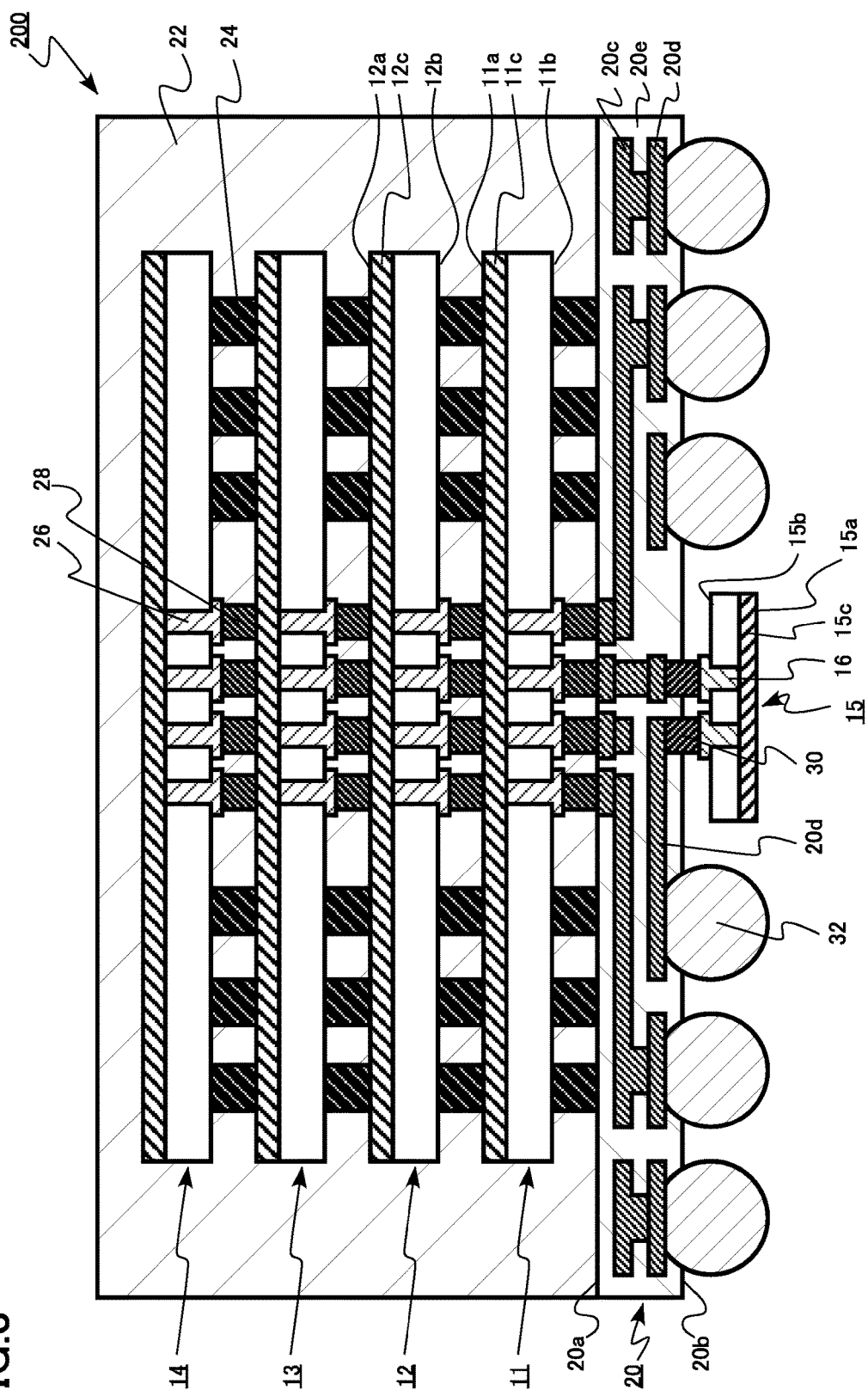
FIG. 3 is a schematic cross-sectional view of a semiconductor device according to a second embodiment.

FIG. 3 is a schematic cross-sectional view of the semiconductor device according to the second embodiment. The semiconductor device according to the second embodiment is a semiconductor memory 200.

The semiconductor memory 200 includes a first memory chip 11, a second memory chip 12, a third memory chip 13, a fourth memory chip 14, a logic chip 15, a TSV 16 (through electrode), a redistribution layer 20 (wiring body), a sealing resin 22 (first resin), a spacer resin 24 (second resin), a TSV 26, a microbump 28, a connection terminal 30, and an external terminal 32.

The semiconductor memory 200 is a redistribution layer 20 manufactured by using a semiconductor manufacturing process and is an FO-WLP which connects the first memory chip 11, the second memory chip 12, the third memory chip 13, and the fourth memory chip 14 to the external terminal 32.

The first memory chip 11 has a front surface 11a (first front surface), a back surface 11b (first back surface), and a memory circuit 11c. The logic chip 15 has a front surface 15a (third front surface), a back surface 15b (third back surface), and a logic circuit 15c.

The back surface 11b of the first memory chip 11 and the back surface 15b of the logic chip 15 face each other. In other words, the back surface 20b of the redistribution layer 20 and the back surface 15b of the logic chip 15 face each other.

The TSV 16 is provided in the logic chip 15. The logic circuit 15c of the logic chip 15 and the first memory chip 11 are electrically connected to each other by using the TSV 16, the connection terminal 30, the redistribution layer 20, and the microbump 28.

In the semiconductor memory 200 according to the second embodiment, it is possible to allow the distance between the logic circuit 15c of the logic chip 15 and the memory circuit 11c of the first memory chip 11 to be longer than that of the semiconductor memory 100 according to the first embodiment. Therefore, malfunction of the memory chip and deterioration of reliability due to heat generation of the logic chip 15 can be further suppressed.

As described above, according to the semiconductor memory 200 according to the second embodiment, as compared with the semiconductor memory 100 according to the first embodiment, malfunction of the memory chip and deterioration of reliability due to heat generation of the logic chip 15 can be further suppressed.

Third Embodiment

A semiconductor device according to a third embodiment is different from the first embodiment in that the first front surface of the first memory chip and the second front surface of the second memory chip face each other. Hereinafter, a portion of the redundant content described in the first embodiment will be omitted in the description.

Figure 4:
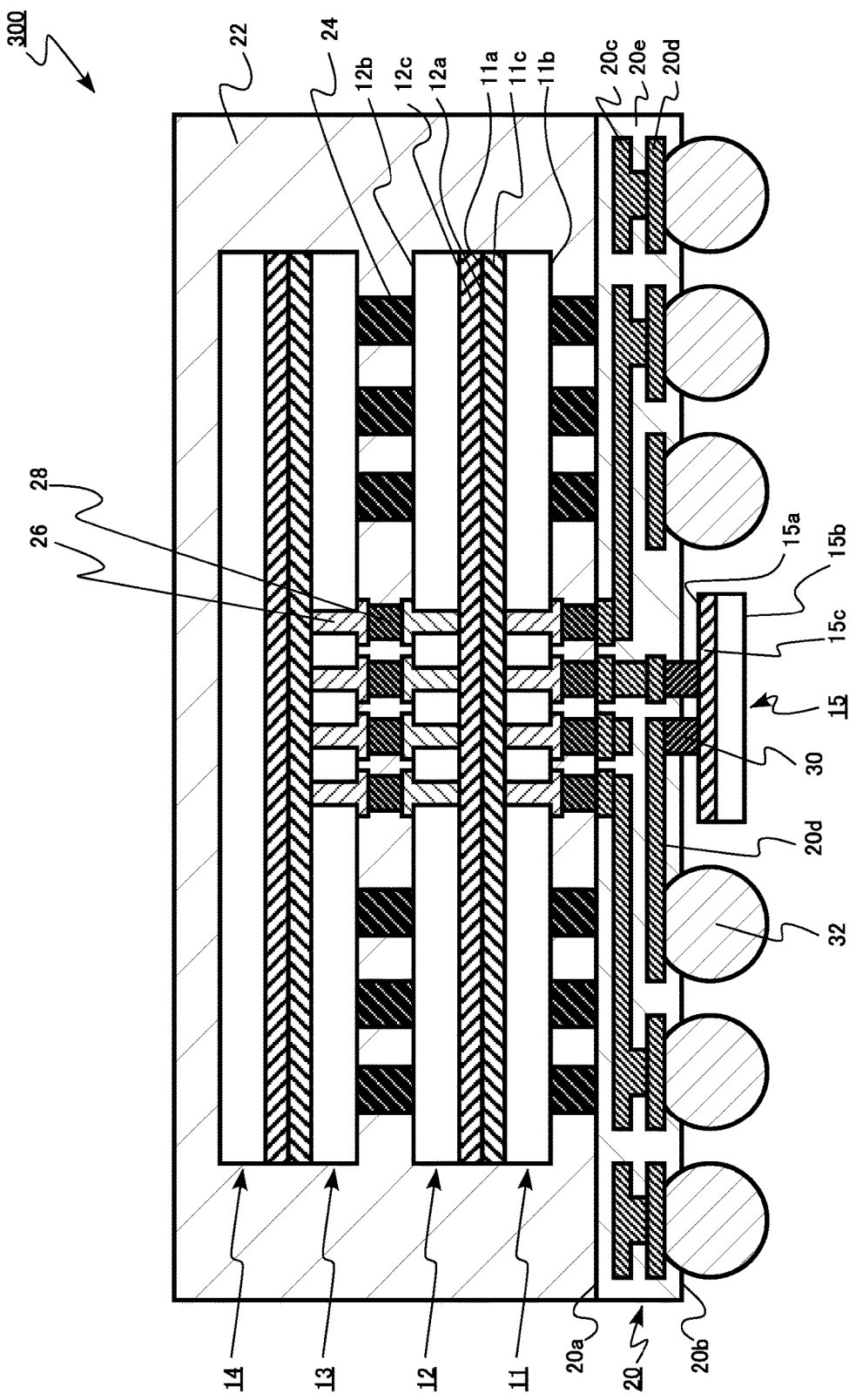
FIG. 4 is a schematic cross-sectional view of a semiconductor device according to a third embodiment.

FIG. 4 is a schematic cross-sectional view of the semiconductor device according to the third embodiment. The semiconductor device according to the third embodiment is a semiconductor memory 300.

The semiconductor memory 300 includes a first memory chip 11, a second memory chip 12, a third memory chip 13, a fourth memory chip 14, a logic chip 15, a redistribution layer 20 (wiring body), a sealing resin 22 (first resin), a spacer resin 24 (second resin), a TSV 26, a microbump 28, a connection terminal 30, and an external terminal 32.

The semiconductor memory 300 is a redistribution layer 20 manufactured by using a semiconductor manufacturing process and is an FO-WLP which connects the first memory chip 11, the second memory chip 12, the third memory chip 13, and the fourth memory chip 14 to the external terminal 32.

The first memory chip 11 has a front surface 11a (first front surface), a back surface 11b (first back surface), and a memory circuit 11c (first memory circuit). The second memory chip 12 has a front surface 12a (second front surface), a back surface 12b (second back surface), and a memory circuit 12c (second memory circuit).

The front surface 11a of the first memory chip 11 and the front surface 12a of the second memory chip 12 face each other and are joined. In other words, the memory circuit 11c of the first memory chip 11 and the memory circuit 12c of the second memory chip 12 face each other and are joined.

From the viewpoint of increasing the speed of the semiconductor memory and reducing the power consumption, it is preferable to reduce the thickness of the memory chip and reduce the parasitic capacitance of the TSV. However, when the TSV is formed at the wafer level, if the wafer becomes too thin, handling becomes difficult.

In the semiconductor memory 300, a wafer including the first memory chip 11 and a wafer including the second memory chip 12 are bonded to each other at the time of manufacturing the TSV. Therefore, the thickness of the first memory chip 11 and the second memory chip 12 can be reduced while maintaining the wafer strength at the time of TSV formation. Therefore, the parasitic capacitance of the TSV is reduced, and the high speed and low power consumption of the semiconductor memory 300 can be realized.

As described above, according to the semiconductor memory 300 according to the third embodiment, malfunction of the memory chip and deterioration of reliability due to heat generation of the logic chip 15 can be suppressed. Furthermore, high speed operation and low power consumption can be realized.

Fourth Embodiment

A semiconductor device according to a fourth embodiment is different from Comparative Example in that the first front surface of the first memory chip and the second back surface of the second memory chip face each other. Hereinafter, a portion of the redundant content described in Comparative Example and the first embodiment will be omitted in the description.

Figure 5:
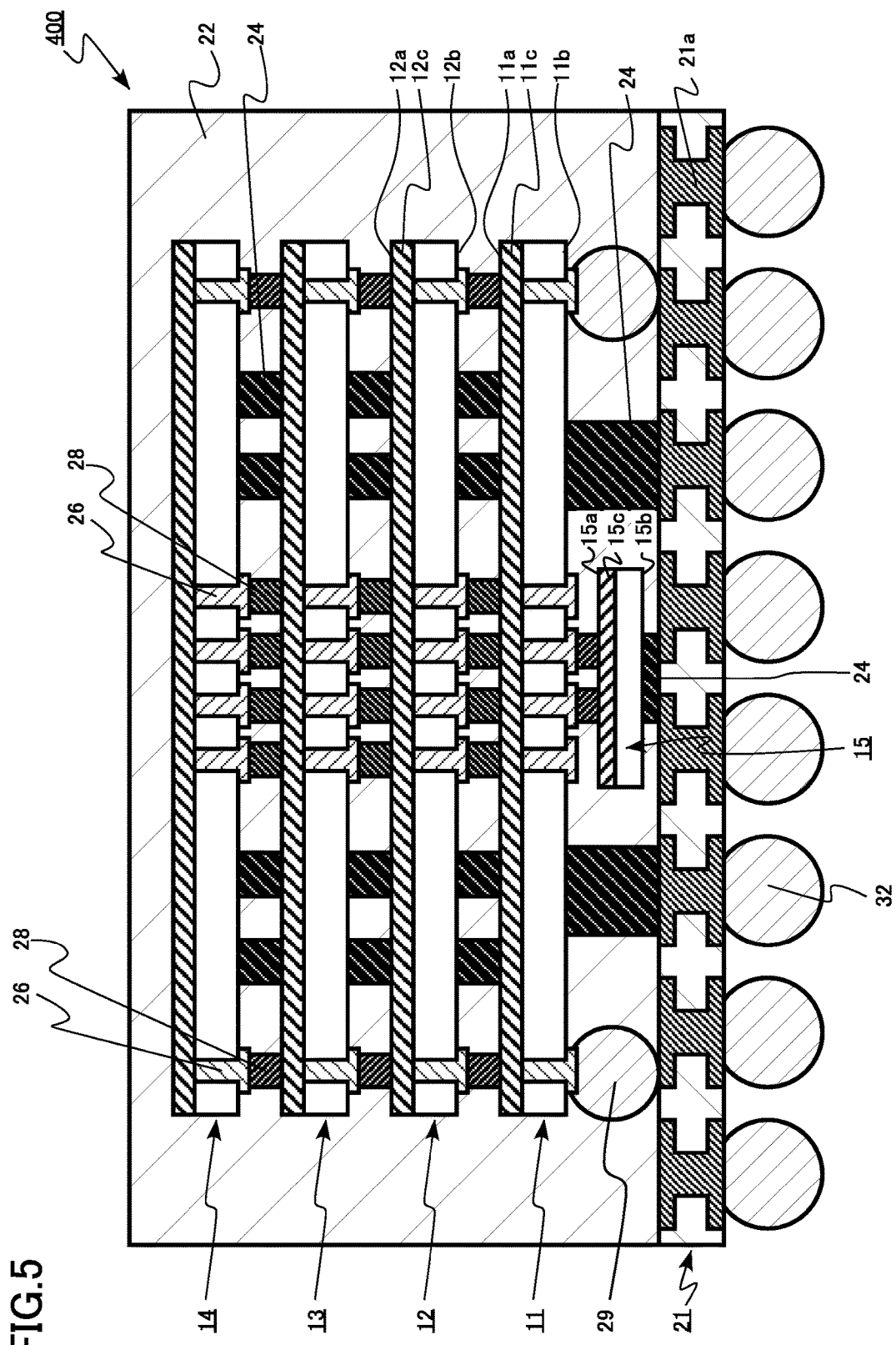
FIG. 5 is a schematic cross-sectional view of a semiconductor device according to a fourth embodiment.

FIG. 5 is a schematic cross-sectional view of the semiconductor device according to the fourth embodiment. The semiconductor device according to the fourth embodiment is a semiconductor memory 400.

The semiconductor memory 400 includes a first memory chip 11, a second memory chip 12, a third memory chip 13, a fourth memory chip 14, a logic chip 15, a silicon interposer 21, a sealing resin 22 (first resin), a spacer resin 24 (second resin), a TSV 26, a microbump 28, a bump 29, a connection terminal 30, and an external terminal 32.

The semiconductor memory 400 is a package which connects the first memory chip 11, the second memory chip 12, the third memory chip 13, and the fourth memory chip 14 to the external terminal 32 by using the silicon interposer 21. For example, by using the bump 29 and the TSV 21a in the silicon interposer 21, the first memory chip 11 is electrically connected to the external terminal 32.

Unlike the semiconductor memory 900 according to Comparative Example, in the semiconductor memory 400, the logic chip 15 and the back surface 11b of the first memory chip 11 face each other. In other words, the logic chip 15 does not face the memory circuit 11c of the first memory chip 11. Therefore, it is possible to allow the distance between the logic chip 15 and the memory circuit 11c of the first memory chip 11 to be longer than that of the semiconductor memory 900.

Unlike the semiconductor memory 900, in the semiconductor memory 400 according to the fourth embodiment, the first memory chip 11 and the second memory chip 12 are stacked such that the back surface 12b of the second memory chip 12 and the front surface 11a of the first memory chip 11 face each other. Therefore, the memory circuit 12c of the second memory chip 12 exists on the side of the second memory chip 12 far from the logic chip 15.

Therefore, in the semiconductor memory 400 according to the fourth embodiment, it is possible to lengthen the distance between the logic chip 15 and the memory circuit 11c of the first memory chip 11 and the distance between the logic chip 15 and the memory circuit 12c of the second memory chip 12. Therefore, malfunction of the memory chip and deterioration of reliability due to heat generation of the logic chip 15 can be suppressed.

As described above, according to the semiconductor memory 400 according to the fourth embodiment, as compared with the semiconductor memory 900 according to Comparative Example, malfunction of the memory chip and deterioration of reliability due to heat generation of the logic chip 15 can be suppressed.

Fifth Embodiment

A semiconductor device according to a fifth embodiment is different from the fourth embodiment in that a third back surface of the logic chip and the first memory chip face each other. Hereinafter, a portion of the redundant content described in the fourth embodiment will be omitted in the description.

Figure 6:
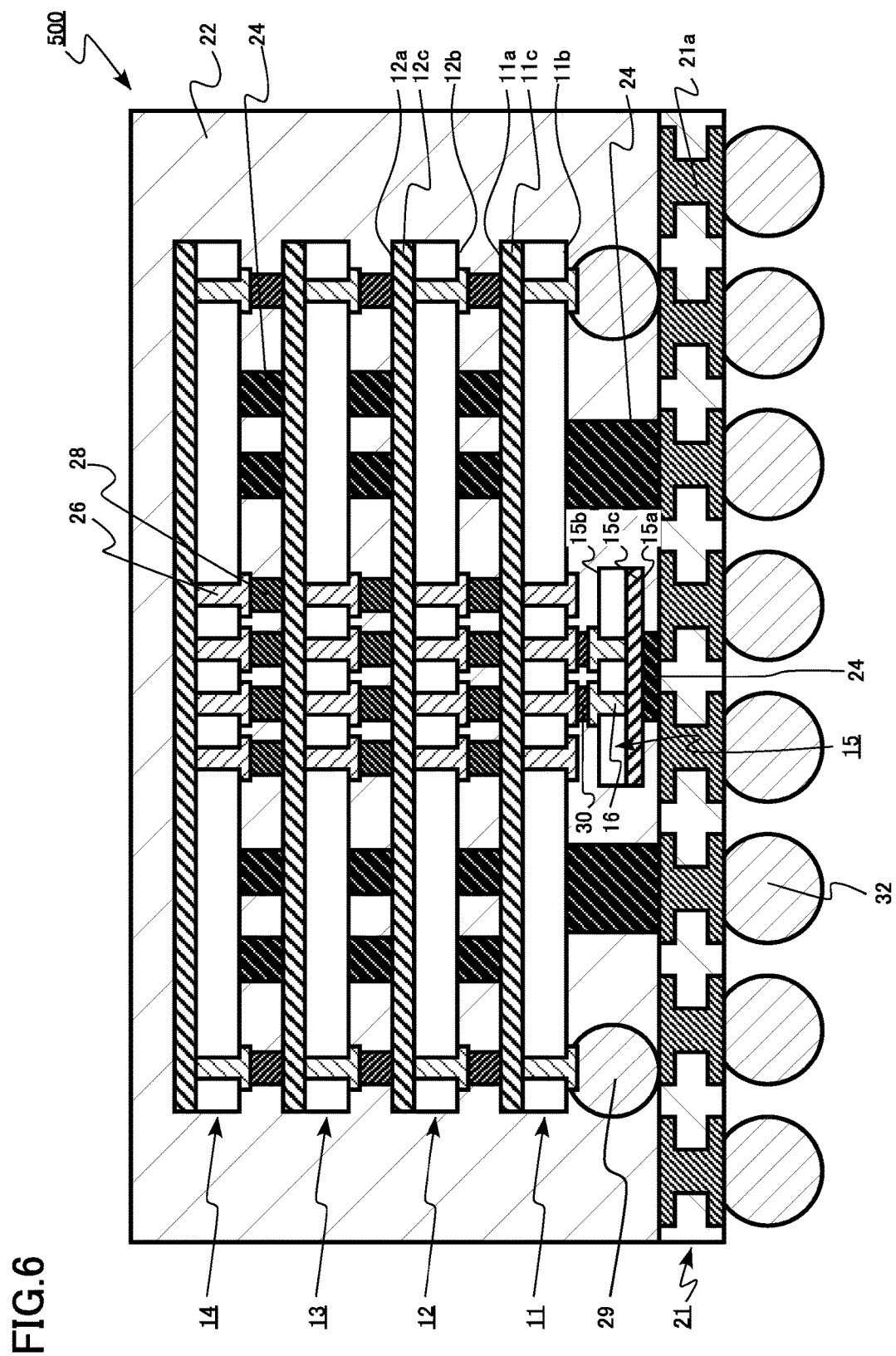
FIG. 6 is a schematic cross-sectional view of a semiconductor device according to a fifth embodiment.

FIG. 6 is a schematic cross-sectional view of the semiconductor device according to the fifth embodiment. The semiconductor device according to the fifth embodiment is a semiconductor memory 500.

The semiconductor memory 500 includes a first memory chip 11, a second memory chip 12, a third memory chip 13, a fourth memory chip 14, a logic chip 15, a TSV 16, a silicon interposer 21, a sealing resin 22 (first resin), a spacer resin 24 (second resin), a TSV 26, a microbump 28, a bump 29, a connection terminal 30, and an external terminal 32.

The semiconductor memory 500 is a package which connects the first memory chip 11, the second memory chip 12, the third memory chip 13, and the fourth memory chip 14 to the external terminal 32 by using the silicon interposer 21. For example, by using the bump 29 and the TSV 21a in the silicon interposer 21, the first memory chip 11 is electrically connected to the external terminal 32.

The TSV 16 is provided in the logic chip 15. The logic circuit 15c of the logic chip 15 and the first memory chip 11 are electrically connected to each other by using the TSV 16 and the connection terminal 30.

Unlike the semiconductor memory 400 according to the fourth embodiment, in the semiconductor memory 500, the back surface 15b of the logic chip 15 and the first memory chip 11 face each other. The logic circuit 15c of the logic chip 15 does not face the memory circuit 11c of the first memory chip 11. Therefore, it is possible to allow the distance between the logic circuit 15c of the logic chip 15 and the memory circuit 11c of the first memory chip 11 to be longer than that of the semiconductor memory 400. Similarly, it is possible to allow the distance between the logic circuit 15c of the logic chip 15 and the memory circuit 12c of the second memory chip 12 to be longer than that of the semiconductor memory 400.

In the semiconductor memory 500 according to the fifth embodiment, it is possible to lengthen the distance between the logic circuit 15c of the logic chip 15 and the memory circuit 11c of the first memory chip 11 and the distance between the logic circuit 15c of the logic chip 15 and the memory circuit 12c of the second memory chip 12. Therefore, malfunction of the memory chip and deterioration of reliability due to heat generation of the logic chip 15 can be suppressed.

As described above, according to the semiconductor memory 500 according to the fifth embodiment, malfunction of the memory chip and deterioration of reliability due to heat generation of the logic chip 15 can be suppressed.

In the first to fifth embodiments, the redistribution layer 20 and the silicon interposer 21 have been described as examples of the wiring body, but the wiring body is not limited to these two examples. It is also possible to apply a package substrate using a glass epoxy resin, for example, as the wiring body.

In the first to fifth embodiments, a case where four memory chips are stacked is described as an example, but the number of stacked memory chips may be two, three, or five or more.

While certain embodiments have been described, these embodiments have been presented byway of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first memory chip having a first front surface and a first back surface, and the first memory chip including a first memory circuit provided on a first front surface side;
   a second memory chip having a second front surface and a second back surface, the second back surface facing the first front surface, the second memory chip including a second memory circuit provided on a second front surface side, and the second memory chip being electrically connected to the first memory chip;
   a logic chip, the first memory chip provided between the logic chip and the second memory chip, the logic chip having a third front surface and a third back surface, the logic chip including a logic circuit provided on a third front surface side, and the logic chip being electrically connected to the first memory chip;
   a wiring body having a fourth front surface and a fourth back surface, the wiring body being provided between the logic chip and the first memory chip, either the third front surface or the third back surface of the logic chip facing the fourth back surface, the wiring body having a width larger than the first memory chip, the wiring body having a wiring, and the wiring body electrically connecting the first memory chip and the logic chip;
   a first resin covering the first memory chip and the second memory chip, and the first resin being provided between the wiring body and the first memory chip; and
   a plurality of second resins being different from the first resin provided between the wiring body and the first memory chip.

2. The semiconductor device according to claim 1, wherein the wiring body has a resin layer, and the wiring is provided in the resin layer.

3. The semiconductor device according to claim 1, further comprising:
   an external terminal being provided on a fourth back surface side of the wiring body, and the external terminal being electrically connected to the wiring; and
   a connection terminal being provided between the logic chip and the wiring body, and the connection terminal electrically connecting the logic chip and the wiring.

4. The semiconductor device according to claim 1, wherein the first back surface and the third back surface face each other.

5. The semiconductor device according to claim 4, wherein the logic chip includes a through electrode being provided in the logic chip, and the through electrode electrically connecting the logic circuit and the first memory chip.

6. A semiconductor device comprising:
   a first memory chip having a first front surface and a first back surface, and the first memory chip including a first memory circuit provided on a first front surface side;
   a second memory chip having a second front surface and a second back surface, the second memory chip including a second memory circuit provided on a second front surface side, the second front surface facing the first front surface, and the second memory chip being electrically connected to the first memory chip;
   a logic chip, the first memory chip provided between the logic chip and the second memory chip, the logic chip having a third front surface and a third back surface, the logic chip including a logic circuit provided on a third front surface side, and the logic chip being electrically connected to the first memory chip;
   a wiring body having a fourth front surface and a fourth back surface, the wiring body being provided between the logic chip and the first memory chip, either the third front surface or the third back surface of the logic chip facing the fourth back surface, the wiring body having a width larger than the first memory chip, the wiring body having a wiring, and the wiring body electrically connecting the first memory chip and the logic chip;
   a first resin covering the first memory chip and the second memory chip, and the first resin being provided between the wiring body and the first memory chip; and
   a plurality of second resins being different from the first resin provided between the wiring body and the first memory chip.

7. The semiconductor device according to claim 6, wherein the wiring body has a resin layer, and the wiring is provided in the resin layer.

8. The semiconductor device according to claim 6, further comprising:
   an external terminal being provided on a fourth back surface side of the wiring body, and the external terminal being electrically connected to the wiring; and
   a connection terminal being provided between the logic chip and the wiring body, and the connection terminal electrically connecting the logic chip and the wiring.

9. The semiconductor device according to claim 8, wherein the external terminal and the connection terminal are electrically connected to each other without passing through a conductor closer to the fourth front surface than the wiring.

10. The semiconductor device according to claim 6, wherein the volume ratio of a filler contained in the first resin is larger than the volume ratio of a filler contained in the second resin.

11. The semiconductor device according to claim 6, wherein the first resin contains a filler, and the second resin does not contain a filler.

12. A semiconductor device comprising:
    a first memory chip having a first front surface and a first back surface, and the first memory chip including a first memory circuit provided on a first front surface side;
    a second memory chip having a second front surface and a second back surface, the second memory chip including a second memory circuit provided on a second front surface side, either the second front surface or the second back surface facing the first front surface, and the second memory chip being electrically connected to the first memory chip;
    a logic chip, the first memory chip provided between the logic chip and the second memory chip, the logic chip having a third front surface and a third back surface, the logic chip including a logic circuit provided on a third front surface side, either the third front surface or the third back surface of the logic chip facing the first back surface, a width of the logic chip being smaller than a width of the first memory chip and a width of the second memory chip and the logic chip being electrically connected to the first memory chip;
    a wiring body having a fourth front surface and a fourth back surface, the logic chip being provided between the wiring body and the first memory chip, either the third front surface or the third back surface of the logic chip facing the fourth front surface, the wiring body having a width larger than the first memory chip, the wiring body having a wiring, and the wiring body electrically connecting the first memory chip and the logic chip;

a first resin covering the first memory chip, the second memory chip and the logic chip, the first resin being provided between the wiring body and the first memory chip, and the first resin being provided between the wiring body and the logic chip; and a plurality of second resins being different from the first resin, a first part of the plurality of second resins provided between the wiring body and the first memory chip.

13. The semiconductor device according to claim 12, wherein a second part of the plurality of second resins are provided between the first memory chip and the second memory chip, the second part of the plurality of second resins is thinner than the first part of the plurality of second resins.

14. The semiconductor device according to claim 12, wherein the first front surface facing the second back surface.

15. The semiconductor device according to claim 12, wherein the first back surface facing the third front surface and the third back surface facing the fourth front surface.

16. The semiconductor device according to claim 12, wherein the first back surface facing the third back surface and the third front surface facing the fourth front surface.

17. The semiconductor device according to claim 16, wherein the logic chip includes a through electrode being provided in the logic chip, and the through electrode electrically connecting the logic circuit and the first memory chip.

18. The semiconductor device according to claim 12, wherein a third part of the plurality of second resins is provided between the wiring body and the logic chip.

19. The semiconductor device according to claim 12, further comprising:

an external terminal being provided on a fourth back surface side of the wiring body, and the external terminal being electrically connected to the wiring.

* * * * *